United States Patent
Kyung

(10) Patent No.: US 9,496,032 B2
(45) Date of Patent: Nov. 15, 2016

(54) VARIABLE RESISTIVE MEMORY DEVICE INCLUDING CONTROLLER FOR DRIVING BITLINE, WORD LINE, AND METHOD OF OPERATING THE SAME

(71) Applicant: SK hynix Inc., Icheon-si Gyeonggi-do (KR)

(72) Inventor: Ki Myung Kyung, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/798,795

(22) Filed: Jul. 14, 2015

(65) Prior Publication Data

US 2016/0260477 A1    Sep. 8, 2016

(30) Foreign Application Priority Data

Mar. 4, 2015  (KR) .................. 10-2015-0030473

(51) Int. Cl.
| | | |
|---|---|---|
| *G11C 11/00* | (2006.01) | |
| *G11C 13/00* | (2006.01) | |
| *G11C 7/12* | (2006.01) | |
| *G11C 7/18* | (2006.01) | |
| *G11C 8/08* | (2006.01) | |

(52) U.S. Cl.
CPC .............. *G11C 13/004* (2013.01); *G11C 7/12* (2013.01); *G11C 7/18* (2013.01); *G11C 13/0002* (2013.01); *G11C 13/0023* (2013.01); *G11C 13/0026* (2013.01); *G11C 13/0028* (2013.01); *G11C 13/0061* (2013.01); *G11C 8/08* (2013.01); *G11C 2213/79* (2013.01)

(58) Field of Classification Search
CPC .......... G11C 13/0069; G11C 13/0004; G11C 13/0023; G11C 13/004; G11C 7/12; G11C 13/0002; G11C 11/1673; G11C 7/08; G11C 8/10; G11C 11/5642; G11C 8/08
USPC ............. 365/148, 158, 163, 230.06; 257/2–5
See application file for complete search history.

(56) References Cited

U.S. PATENT DOCUMENTS

| | | | |
|---|---|---|---|
| 8,023,320 B2 * | 9/2011 | Kim ........................ | G11C 7/12 365/148 |
| 8,467,229 B2 * | 6/2013 | Ikeda ................. | G11C 13/0007 365/148 |
| 8,625,326 B2 * | 1/2014 | Hosono .................... | G11C 8/08 365/148 |

FOREIGN PATENT DOCUMENTS

| | | |
|---|---|---|
| KR | 1020100088914 A | 8/2010 |
| KR | 1020130091909 A | 8/2013 |

* cited by examiner

*Primary Examiner* — David Lam
(74) *Attorney, Agent, or Firm* — William Park & Associates Ltd.

(57) ABSTRACT

A variable resistive memory device may include a memory region and controller. The memory region may include a plurality of unit memory cells each electrically connected between a word line and a bit line. The controller may perform a driving operation of the word line in response to a read command. The controller may perform a driving operation of a bit line to output cell data through the bit line substantially simultaneously with the driving operation of the word line. Each of the unit memory cell may include a variable resistive material.

21 Claims, 6 Drawing Sheets

VARIABLE RESISTIVE MEMORY DEVICE INCLUDING CONTROLLER FOR DRIVING BITLINE, WORD LINE, AND METHOD OF OPERATING THE SAME

CROSS-REFERENCES TO RELATED APPLICATION

The present application claims priority under 35 U.S.C. §119(a) to Korean application number 10-2015-0030473, filed on Mar. 4, 2015, in the Korean Intellectual Property Office, which is incorporated herein by reference in its entirety.

BACKGROUND

1. Technical Field

Various embodiments generally relate to a semiconductor device, more particularly, to a variable resistive memory device and method of operating the variable resistive memory device.

2. Related Art

A semiconductor memory device having a large storage capacity and a rapid operational speed while still consuming relatively low amounts of power have been developed.

Semiconductor memory devices may be classified, generally, into either a volatile memory device or a non-volatile memory device. Flash memory devices of the non-volatile memory device kind may be used for a relatively long time. Recently, a variable resistive memory device of the non-volatile memory device kind is being widely used. The variable resistive memory device has logic levels of data that are determined in accordance with the resistances of the data storage materials.

The operational speed of the semiconductor memory device is determined by various factors. Any one of the factors may include a read cycle time (tRC). The tRC may relate to an output time of data within a memory cell in response to a read command.

As semiconductor memory devices become highly integrated, numbers of cells within a memory region of the semiconductor memory device greatly increase. Determination of the tRC may be related to bit line loading and word line loading.

SUMMARY

In an embodiment, there may be provided a variable resistive memory device. The variable resistive memory device may include a memory region and controller. The memory region may include a plurality of unit memory cells each electrically connected between a word line and a bit line. The controller may perform a driving operation of the word line in response to a read command. The controller may perform a driving operation of a bit line to output cell data through the bit line substantially simultaneously with the driving operation of the word line. Each of the unit memory cell may include a variable resistive material.

In an embodiment, there may be provided a method of operating a variable resistive memory device including a memory region and a controller. The memory region may include unit memory cells each electrically connected between a word line and a bit line and including a variable resistive material. The controller may be configured to control the memory region. In the method of operating the variable resistive memory device, the controller may perform a driving operation of the word line in response to a read command. The controller may perform a driving operation of a bit line to output cell data through the bit line substantially simultaneously with the driving operation of the word line.

DETAILED DESCRIPTION

Figure 1:
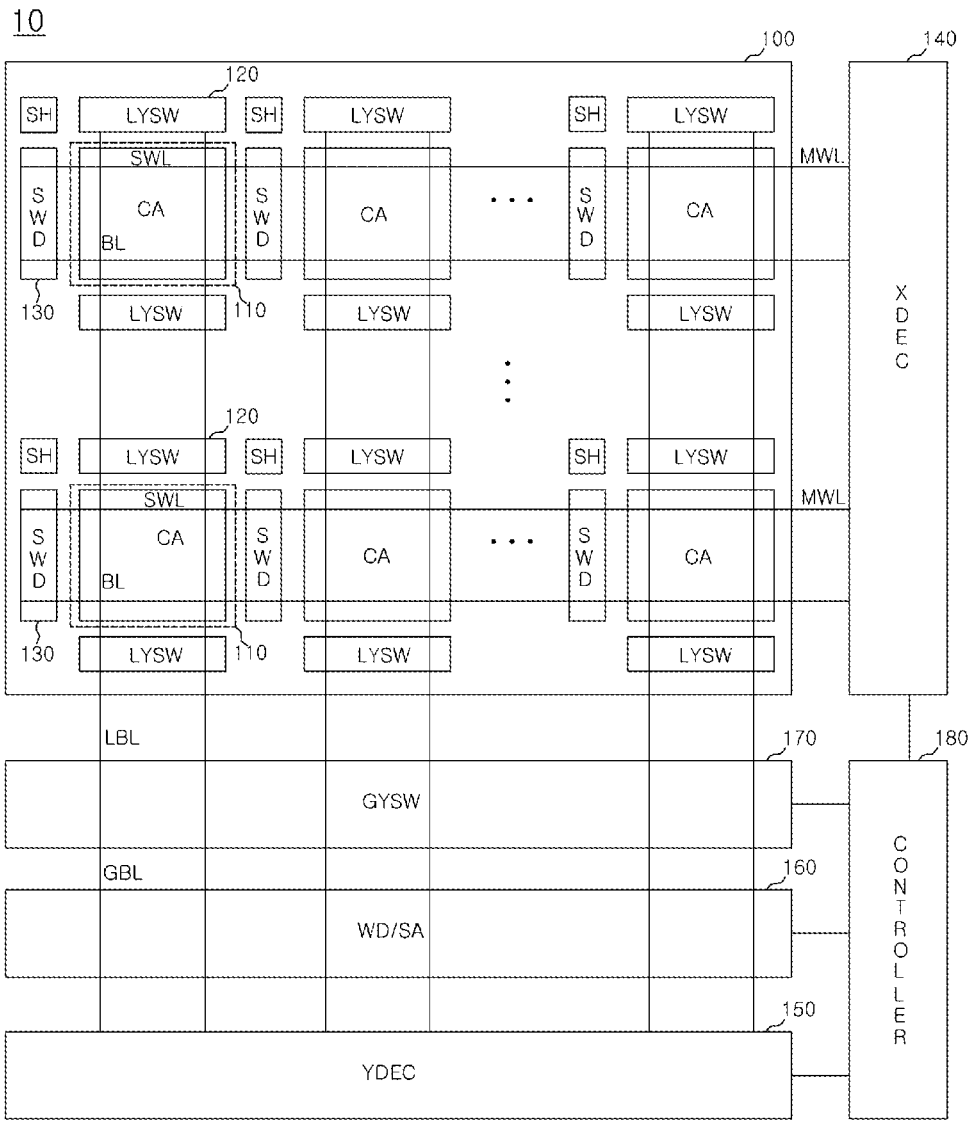
FIG. 1 is a block diagram illustrating a representation of an example of a variable resistive memory device in accordance with an embodiment.

Various example embodiments will be described hereinafter with reference to the accompanying drawings, in which some examples of embodiments are illustrated. The embodiments may, however, be embodied in many different forms and should not be construed as limited to the examples of embodiments set forth herein. Rather, these examples of embodiments are provided so that this disclosure will be thorough and complete, and will fully convey the scope of the application to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terminology used herein is for the purpose of describing particular examples of embodiments only and is not intended to be limiting of the application. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this application belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained with reference to the accompanying drawings.

FIG. 1 is a block diagram illustrating a representation of an example of a variable resistive memory device in accordance with an embodiment.

Referring to FIG. 1, an example of a variable resistive memory device 10 may include a memory region 100, a row decoder (XDEC) 140, and a column decoder (YDEC) 150. The variable resistive memory device 10 may include a read/write circuit (WD/SA) 160, a global bit line switch block (GYSW) 170 and a controller 180.

The memory region 100 may include a plurality of cell blocks 110, a local bit line switch block (LYSW) 120, and a sub-word line drive block (SWD) 130. The local bit line switch block (LYSW) 120 may be arranged at one side of the cell blocks 110. The sub-word line drive block (SWD) 130 may be arranged at the other side of the cell blocks 110 to drive a sub-word line SWL. The sub-word line drive block (SWD) 130 may intersect with the local bit line switch block 120.

Each of the cell blocks 110 may include a cell array CA having a plurality of memory cells. The memory cells may be electrically connected between a word line MWL and SWL, and a bit line BL.

Figure 2:
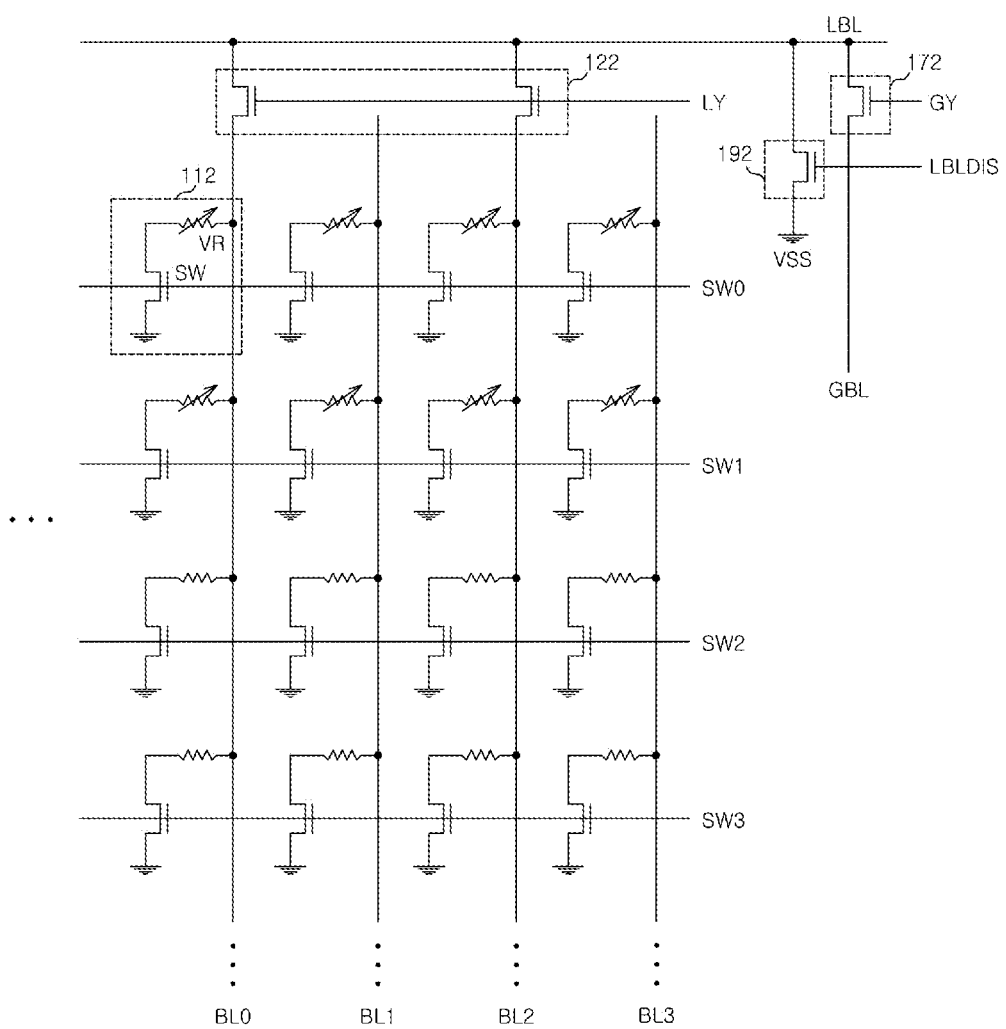
FIG. 2 is a circuit diagram illustrating a representation of an example of a method of operating a variable resistive memory device in accordance with an embodiment.

Although not depicted in FIG. 1, referring to FIG. 2, each of the memory cells, that is, a unit memory cell 112 may include a variable resistive material VR and a switching element SW.

Referring to FIG. 1, a sub-hole SH may be arranged at an intersected position between the local bit line switch block (LYSW) 120 and the sub-word line drive block (SWD) 130. A driver, an input/output switch, etc., for driving the sub-word line drive block (SWD) 130 may be arranged in the sub-hole SH.

In an example of an embodiment, a bit line extended to the local bit line switch block 120 in the cell block 110 may be referred to as a bit line BL. A bit line extended from the local bit line switch block 120 to the global bit line switch block 170 may be referred to as a local bit line LBL. A bit line extended from the global bit line switch block 170 to the read/write circuit 160 may be referred to as a global bit line GBL. A word line extended from the row decoder 140 to the sub-word line drive block 130 may be referred to as a main word line MWL. A word line extended from the sub-word line drive block 130 into the memory cell block 110 may be referred to as a sub-word line (SWL).

Hereinafter, a driving operation of a word line may correspond to the driving of the sub-word line SWL through the main word line MWL electrically connected to the memory cell that is to be accessed.

A read operation in the variable resistive memory device may include the driving operation of the word line, that is, the driving operation of the sub-word line SWL, and a driving operation of the bit line BL. The controller 180 may control the driving operation of the word line and the driving operation of the bit line BL substantially simultaneously performed with each other.

FIG. 2 is a circuit diagram illustrating a representation of an example of a method of operating a variable resistive memory device in accordance with an embodiment.

Referring to FIG. 1 and FIG. 2, the main word line MWL connected to the unit memory cell 112, which may correspond to a row address provided from the controller 180 for driving the word line, may be activated in response to a read command. The sub-word line SWL connected to the unit memory cell 112 through the sub-word line drive block 130 (see FIG. 1) may be driven to provide the sub-word line SWL (i.e., SW0 to SW3) of the memory cell 112 with a predetermined level of a voltage.

The driving operation of the bit line BL (i.e., BL0 to BL3) may output cell data through the bit line BL. The driving operation of the bit line BL may include an operation for pre-charging the bit line BL, an operation for stabilizing the bit line BL, and an operation for sensing and outputting sensed data.

A global bit line switch 172 and a local bit line switch 122 connected to the unit memory cell 112, which may correspond to a column address provided from the controller 180 (see FIG. 1), may be turned-on in response to the read command. A predetermined level of a pre-charge voltage may be applied to the bit line BL through the global bit line GBL and the local bit line LBL.

The operation for stabilizing the bit line BL (i.e., BL0 to BL3) may correspond to a waiting time in which a voltage level of the bit line BL after applying the pre-charge voltage to the bit line BL may be stabilized to accurately determine the cell data.

The operation for sensing and outputting the sensed data may include transmitting the cell data to the read/write circuit 160 (see FIG. 1) through the bit line BL, the local bit line LBL and the global bit line GBL.

In an embodiment, the driving operation of the word line and the driving operation of the bit line BL may be performed substantially simultaneously with each other. The driving operation of the word line may require a time (a)ns. The driving operation of the bit line BL may require a time (b)ns for pre-charging the bit line BL, a time (c)ns for stabilizing the bit line BL, and a time (d)ns for sensing and outputting the sensed data (where a, b, c and d generally represent a number).

Therefore, when the driving operation of the bit line is performed during the performance of the driving operation of the word line, the sub-word line SWL and the bit line BL may be simultaneously driven in a time (b+c+d)ns.

When numbers of the cells in the memory region 100 (see FIG. 1) are doubled, an RC delay time may be increased in proportion to loading increases of the word line WL (i.e., SW1 to SW3 and/or MWL) and the bit line BL. That is, when a length of the word line WL or a bit line BL is increased, a resistance (R) and a capacitance (C) parasitic on the word line WL or the bit line BL may also be doubled so that the RC delay time in the word line WL or the bit line BL may be multiplied four times. Thus, it may be required to decrease the read cycle time (tRC) in a highly integrated semiconductor memory device.

In an example of an embodiment, the read cycle time (tRC) may be remarkably decreased by simultaneously performing the driving operation of the word line WL and the driving operation of the bit line BL. As a result, the highly integrated semiconductor memory device may have a rapid operational speed.

Referring to FIG. 2, a discharge switch 192 may be driven by a discharge signal LBLDIS. The discharge switch 192 may correspond to a switch for stabilizing voltages of the local bit line LBL and the bit line BL. The discharge switch 192 may be coupled between a local bit line LBL and a ground voltage VSS terminal.

Figure 3:
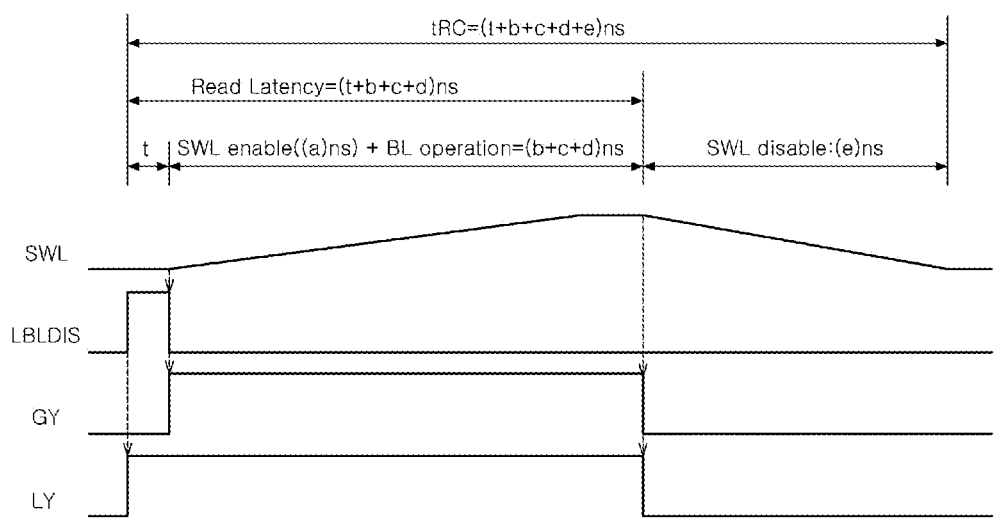
FIG. 3 is a timing chart illustrating a representation of an example of a method of operating a variable resistive memory device in accordance with an embodiment.

FIG. 3 is a timing chart illustrating a representation of an example of a method of operating a variable resistive memory device according to an embodiment.

Referring to FIGS. 1 to 3, the controller 180 may drive the column decoder 150 in response to the read command. The discharge switch 192 connected to a cell to be accessed may be driven by the discharge signal LBLDIS in response to the read command. The local bit line switch 122 may be driven by a local bit line selection signal LY to discharge the local bit line LBL and the bit line BL.

The sub-word line SWL may be driven simultaneously or substantially simultaneously with the bit line BL. Particularly, the controller 180 may perform the operation for driving the sub-word line SWL connected to a cell to be accessed through the row decoder 140 and the sub-word line drive block 130 for the time (a)ns.

During the driving of the local bit line switch 122, the controller 180 may drive the global bit line switch 172 connected to the cell to be accessed to perform the driving operation of the bit line BL for sensing the cell data. The global bit line switch 172 may be driven by the global bit line selection signal GY.

The driving operation of the bit line BL may include the operation for pre-charging the bit line BL for the time (b)ns, the operation for stabilizing the bit line BL for the time (c)ns, and the operation for reading and outputting the cell data for the time (d)ns. Thus, the driving operation of the bit line BL may require the time (b+c+d)ns.

As illustrated in FIG. 3, it can be noted that the driving operation of the sub-word line SWL and the driving operation of the bit line may be simultaneously performed with each other.

A read latency may be a time (t+b+c+d)ns considering a discharge time (t)ns of the bit line BL before driving the sub-word line SWL and the bit line BL.

After completing the driving operation of the word line WL and the driving operation of the bit line BL, the sub-word line SWL and the bit line BL may be simultaneously or substantially simultaneously disabled from each other. Thus, when a fully disabled time of the sub-word line SWL and the bit line BL is (e)ns, the read cycle time (tRC) may be (t+b+c+d+e)ns.

The current may flow through the global bit line GBL, the local bit line LBL and the bit line BL by simultaneously driving the sub-word line SWL and the bit line BL. A charge on the bit line BL may be introduced into the variable resistive material VR through the switching element SW.

In an example of an embodiment, when the charge on the bit line BL is rapidly introduced into the variable resistive material VR, a high voltage may be rapidly applied to the variable resistive material VR to lose the data in the memory cell.

Figure 4:
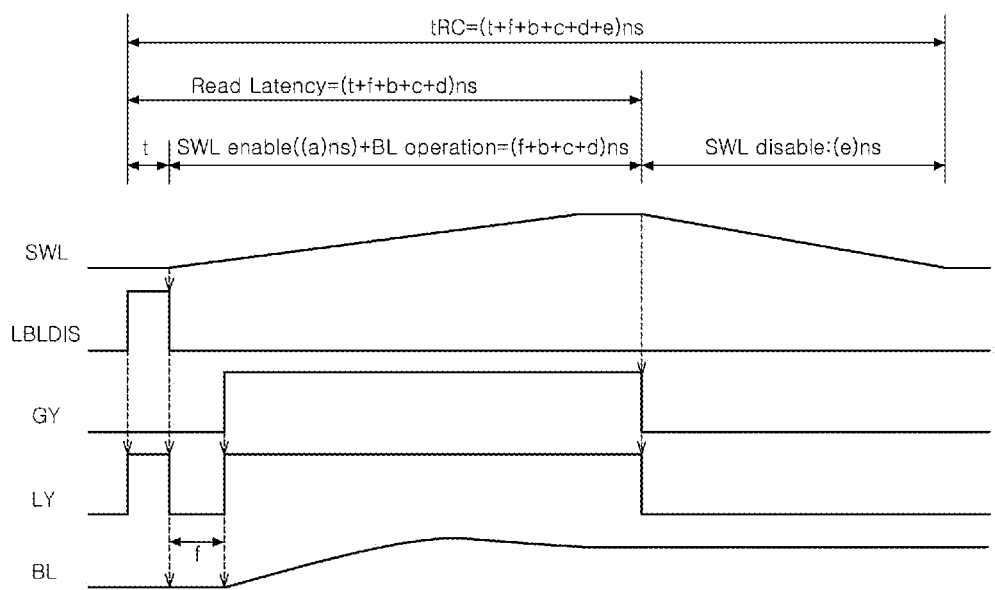
FIG. 4 is an example of a timing chart illustrating a method of operating a variable resistive memory device in accordance with an embodiment.

In order to prevent the data from being lost, as illustrated in FIG. 4, after driving the sub-word line SWL, the driving operation of the bit line BL may be performed after waiting for a time (f)ns. The waiting time (f)ns may be greatly shorter than the time for driving the sub-word line SWL. Thus, the driving operation of the bit line BL may be performed after waiting for the time (f)ns to prevent the high voltage from being rapidly applied to the memory cell.

In an example of an embodiment, a sum of the waiting time (f)ns and the time (b+c+d)ns for driving the bit line BL may be substantially the same as the time (a)ns for driving the word line. The waiting time (f)ns may act as to control a turn-on time of the local bit line switch 122 and the global bit line switch 172 by a predetermined command or a fuse option.

Figure 5:
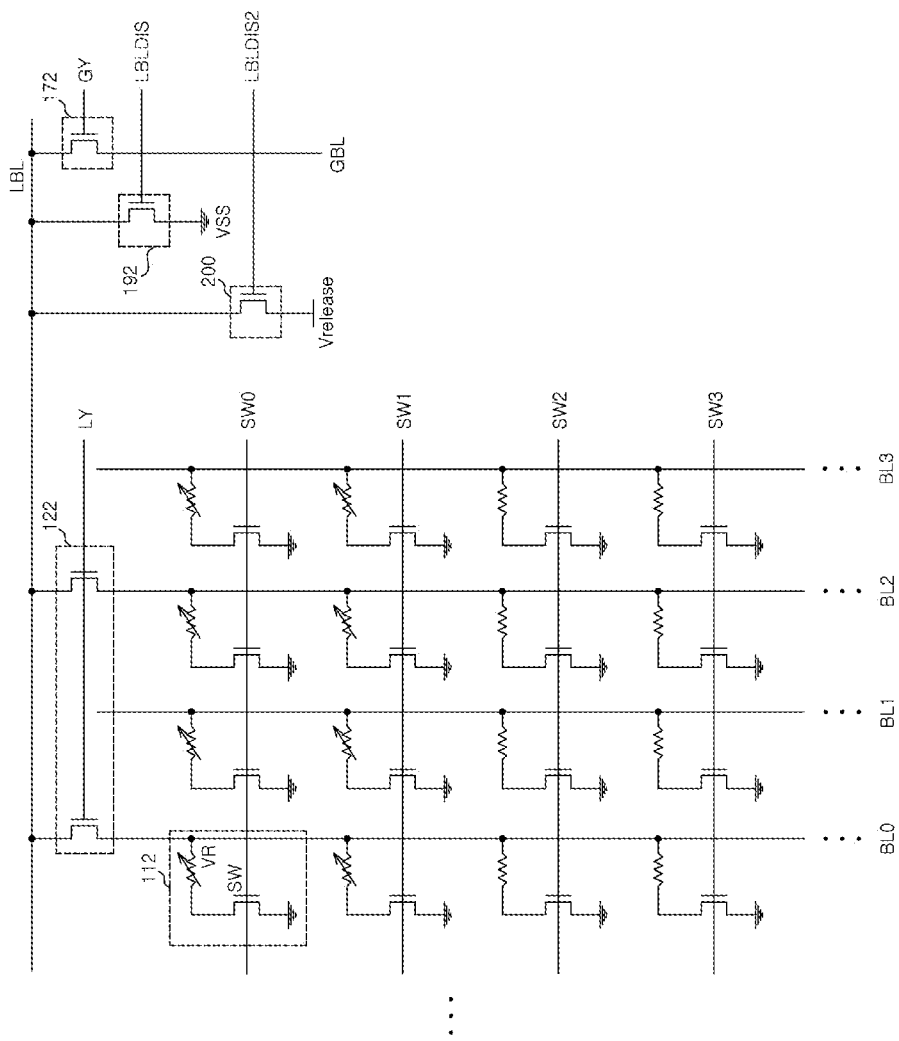
FIG. 5 is a block diagram illustrating a representation of an example of a variable resistive memory device in accordance with an embodiment.

FIG. 5 is a block diagram illustrating a representation of an example of a variable resistive memory device in accordance with an embodiment.

Referring to FIG. 5, a release circuit 200 may be driven by a release signal LBLDIS2. The release circuit 200 may include a switching element electrically connected between the local bit line LBL and a supply terminal of a release voltage Vrelease. The release voltage Vrelease may include, for example but not limited to, a ground voltage or a read voltage.

The release signal LBLDIS2 may be enabled simultaneously or substantially simultaneously with the driving operation of the word line WL to drive the release circuit 200 for the waiting time (f)ns, thereby decreasing the current in the bit line BL. After the waiting time (f)ns, the release signal LBLDIS2 may be disabled and the driving operation of the bit line BL may be performed.

As mentioned above, the waiting time (f)ns may be greatly shorter than the time for driving the sub-word line SWL. The sum of the waiting time (f)ns and the time (b+c+d)ns for driving the bit line may be substantially the same as the time (a)ns for driving the word line.

In an example of an embodiment, the switching element in the release circuit 200 may include a MOS transistor. The MOS transistor may have a channel length longer than a channel length of a switching element of the local bit line switch 122 and the global bit line switch 172.

In an example of an embodiment, when the release voltage Vrelease includes the read voltage, it may not be required to accurately control the waiting time (f)ns.

In an example of an embodiment, the release circuit 200 may be arranged at a region of the sub-hole SH (see FIG. 1), a region of the local bit line switch block 120 or an upper region or a lower region of the memory region 100. Alternatively, when the release circuit 200 is arranged in the region of the local bit line switch block 120, the release circuit 200 may be connected to each of the bit lines BL (i.e., BL0 to BL3 etc.). When the release circuit 200 is arranged at the upper region or the lower region of the memory region 100, the release circuit 200 may be connected to each of the global bit lines GBL.

Figure 6:
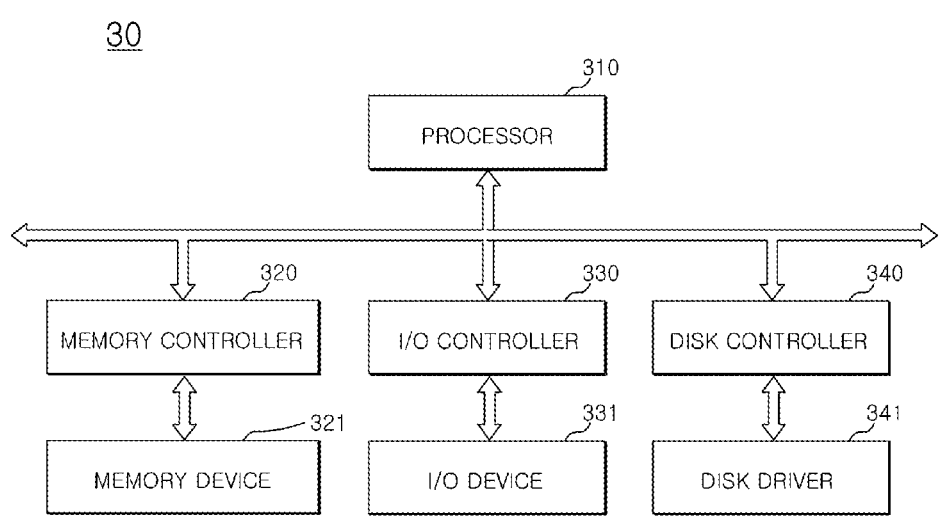
FIG. 6 is a block diagram illustrating a representation of an example of an electronic system in accordance with an embodiment.

FIG. 6 is a block diagram illustrating a representation of an example of an electronic system in accordance with an embodiment.

Referring to FIG. 6, an electronic system 30 may include a processor 310, a memory controller 320, and a memory device 321. The electronic system 30 may include an I/O controller 330, an I/O device 331, a disk controller 340, and a disk driver 341.

The processor 310 may include a single processor or multiple processors. The processor 310 may be independently operated. Alternatively, the processor 310 may be operated dependent upon other processors. The processor 310 may be communicated with other devices such as the memory controller 320, the I/O controller 330 and the disk controller 340 through a bus such as a control bus, an address bus, a data bus, etc.

The memory controller 320 may be electrically connected to the memory device 321. The memory controller 320 may receive commands from the processor 310. The memory controller 320 may control the memory device 321 based on the commands. The memory device 321 may include the semiconductor memory device illustrated with reference to FIGS. 1 to 5.

The I/O controller 330 may be electrically connected between the processor 310 and the I/O device 331. The I/O controller 330 may transmit inputs from the I/O device 331 to the processor 331. The I/O controller 330 may transmit processed results of the processor 310 to the I/O device 331. The I/O device 331 may include an input device such as a keyboard, a mouse, a touch screen, a mike, etc., and an output device such as a display, a speaker, etc.

The disk controller 340 may control the disk driver 341 by the processor 310.

When the read command is provided to the memory device 321 by the processor 310 in the electronic system 30, the semiconductor memory device 321 may simultaneously perform the driving operation of the word line and the driving operation of the bit line so that the semiconductor memory device 321 may perform a rapid read operation for a short read cycle time.

While various embodiments have been described above, it will be understood to those skilled in the art that the embodiments described are by way of example only. Accordingly, the circuit and method described herein should not be limited based on the described embodiments.

What is claimed is:

1. A variable resistive memory device comprising:
   a memory region including a plurality of unit memory cells each electrically connected between a word line and a bit line and including a variable resistive material; and
   a controller configured to perform a driving operation of the word line in response to a read command simultaneously with a driving operation of the bit line for outputting cell data through the bit line,
   wherein the driving operation of the word line comprises driving a selected word line with a predetermined level of voltage by activating the selected word line,
   wherein the driving operation of the bit line comprises pre-charging the bit line, stabilizing the bit line, sensing and outputting the cell data, and
   wherein the driving operation of the bit line is performed while a level of voltage of the selected word line reaches the predetermined level of voltage.

2. The variable resistive memory device of claim 1, wherein the variable resistive material of each unit memory cell is coupled between the bit line and the word line.

3. The variable resistive memory device of claim 1, wherein the controller controls a time for driving the word line with substantially the same time as for driving the bit line.

4. The variable resistive memory device of claim 1, wherein the controller discharges the bit line for a predetermined time simultaneously with the driving operation of the word line before performing the driving operation of the bit line.

5. The variable resistive memory device of claim 4, wherein the controller operates discharging the bit line and driving the bit line during the driving of the word line.

6. The variable resistive memory device of claim 1, further comprising:
   a release circuit electrically connected to the bit line to supply a release voltage to the bit line in response to a release signal.

7. The variable resistive memory device of claim 6, wherein the release circuit is enabled for a predetermined time simultaneously with the driving operation of the word line before driving the bit line.

8. The variable resistive memory device of claim 6, wherein the release circuit is enabled for supplying the release voltage to the bit line and driving the bit line during the driving of the word line.

9. The variable resistive memory device of claim 6, wherein the release voltage comprises a ground voltage or a read voltage.

10. The variable resistive memory device of claim 6, wherein the release circuit includes a MOS transistor, the MOS transistor coupled between the bit line and a supply terminal of the release voltage and having a gate configured to receive the release signal.

11. The variable resistive memory device of claim 10, further comprising:
    a local bit line switch coupled to the release circuit through a local bit line and coupled to the unit memory cells through respective bit lines; and
    a global bit line switch coupled to the local bit line and configured to apply a predetermined level of a pre-charge voltage to a bit line through a global bit line coupled to the global bit line switch,
    wherein the MOS transistor has a channel length longer than a channel length of a switching element of the local bit line switch and the global bit line switch.

12. The variable resistive memory device of claim 10, further comprising:
    cell blocks located in the memory region, the cell blocks including the unit memory cells; and
    a local bit line switch block located at one side of each cell block;
    wherein the release circuit is located within a region of the local bit line switch block.

13. The variable resistive memory device of claim 1, wherein the controller simultaneously disables the word line and the bit line after the driving operation of the word line and the driving operation of the bit line.

14. A method of operating a variable resistive memory device, the variable resistive memory device including a memory region and a controller, the memory region including a plurality of unit memory cells each electrically connected between a word line and a bit line and including a variable resistive material, and the controller for controlling the memory region, the method comprising:
    performing a driving operation of the word line in response to a read command by the controller,
    wherein the driving operation of the word line is performed simultaneously with a driving operation of the bit line for outputting cell data through the bit line,
    wherein the driving operation of the word line comprises driving a selected word line with a predetermined level of voltage by activating the selected word line,
    wherein the driving operation of the bit line comprises pre-charging the bit line, stabilizing the bit line, and sensing and outputting the cell data, and
    wherein the driving operation of the bit line is performed while a level of voltage of the selected word line reaches the predetermined level of voltage.

15. The method of claim 14, wherein the controller controls a time for driving the word line with substantially the same time as for driving the bit line.

16. The method of claim 14, wherein the controller discharges the bit line for a predetermined time simultaneously with the driving operation of the word line before performing the driving operation of the bit line.

17. The method of claim 16, wherein the controller operates discharging the bit line and driving the bit line during the driving of the word line.

18. The method of claim 14, further comprising:
    supplying a release voltage to the bit line for a predetermined time simultaneously with the driving operation of the word line before performing the driving operation of the bit line by the controller.

19. The method of claim 18, wherein the controller controls supplying the release voltage to the bit line and driving the bit line during the driving of the word line.

20. The method of claim 18, wherein the release voltage comprises a ground voltage or a read voltage.

21. The method of claim 14, wherein the controller simultaneously disables the word line and the bit line after the driving operation of the word line and the driving operation of the bit line.

* * * * *